United States Patent
Watanabe et al.

(10) Patent No.: US 8,389,055 B2
(45) Date of Patent: Mar. 5, 2013

(54) SUBSTRATE WITH MICROMETALLIC MASSES ALIGNED ON THE SURFACE

(75) Inventors: Shigeru Watanabe, Kouchi (JP); Jingze Li, Machida (JP)

(73) Assignee: Japan Science and Technology Agency, Saitama (JP)

( * ) Notice: Subject to any disclaimer, the term of this patent is extended or adjusted under 35 U.S.C. 154(b) by 619 days.

(21) Appl. No.: 12/226,398

(22) PCT Filed: Apr. 4, 2007

(86) PCT No.: PCT/JP2007/057565
§ 371 (c)(1),
(2), (4) Date: Oct. 17, 2008

(87) PCT Pub. No.: WO2007/122998
PCT Pub. Date: Nov. 1, 2007

(65) Prior Publication Data
US 2009/0087582 A1     Apr. 2, 2009

(30) Foreign Application Priority Data
Apr. 19, 2006   (JP) .................. 2006-115562

(51) Int. Cl.
*B05D 5/00* (2006.01)
*B05D 3/00* (2006.01)
*B05D 1/32* (2006.01)
*C08J 7/18* (2006.01)

(52) U.S. Cl. ........ 427/272; 427/256; 427/270; 427/271; 427/553

(58) Field of Classification Search .................. 427/256, 427/270, 271, 272, 553
See application file for complete search history.

(56) References Cited

U.S. PATENT DOCUMENTS
2003/0185985 A1 * 10/2003 Bronikowski et al. ........ 427/258

FOREIGN PATENT DOCUMENTS

| JP | 2001-151834 | 6/2001 |
| JP | 2003-318010 | 11/2003 |
| JP | 2004-500226 | 1/2004 |
| JP | 2004 098246 | 4/2004 |
| JP | 2004124088 A * | 4/2004 |
| JP | 2005 195440 | 7/2005 |
| JP | 2005 225887 | 8/2005 |
| JP | 2006-088310 | 4/2006 |
| JP | 2006-273890 | 10/2006 |

(Continued)

OTHER PUBLICATIONS
Haupt et al., Semiconductor nanostructures defined with self-organizing polymers, J. App. Phys., 91, 6057-59.*

(Continued)

*Primary Examiner* — Katherine A Bareford
*Assistant Examiner* — James M Mellott
(74) *Attorney, Agent, or Firm* — Jenkins, Wilson, Taylor & Hunt, P.A.

(57) ABSTRACT

A process for preparing a metal nanostructure having metal masses with zero valence aligned on a substrate surface wherein the size and shape of the metal masses are controlled is described. The process can include preparing a micro phase separation membrane of an amphiphilic block copolymer on a substrate and then exposing the membrane to a solution containing metal ions; drying the membrane to form a micro phase separation membrane with the metal ions localized in hydrophilic segments of the membrane; and irradiating vacuum ultraviolet light on the membrane to reduce the metal ions and to remove organic materials.

3 Claims, 7 Drawing Sheets

FOREIGN PATENT DOCUMENTS

WO    WO2007/122998    11/2007

OTHER PUBLICATIONS

Aizawa et al., Block Copolymer-Templated Chemistry on Si, Ge, InP, and GaAs Surfaces, JACS 2005, 127, pp. 8932-8933.*

Spatz et al., Gold Nanoparticles in Micellar Poly(styrene)-b-Poly-(ethylene oxide) Films—Size and Interparticle Distance Control in Monoparticulate Films, Advanced Materials 1996, 8, No. 4, pp. 337-340.*

Watanabe et al., Fabrication of two-dimensional arrays of gold nanoparticles using phase separated amphiphilic block copolymer films as templates, Japan Society of Applied Physics, Mar. 22, 2006.*

Lengl et al., Excimer laser ablation of gold-loaded inverse polystyrene-bloc-poly(2-vinylpyridine) micelles, App. Phys. A, 72, 679-685, 2001.*

Berven et al., Defect-Tolerant Single-Electron Charging at Room Temperature in Metal Nanoparticle Decorated Biopolymers. *Advanced Materials*. vol. 13, No. 2 pp. 109-113 (2001).

Hornyak et al., Gold Clusters and Colloids in Alumina Nanotubes. *Chemistry: A European Journal*. vol. 3, No. 12 pp. 1951-1956 (1997).

Matsumoto et al., Optical Properties of Long-range-ordered, High-density Gold Nanodot Arrays Prepared Using Anodic Porous Alumina. *Chemistry Letters*. vol. 34, No. 4 pp. 508-509 (2005).

Notification of Transmittal of Translation of the International Preliminary Report on Patentability (Chapter I or Chapter II of the Patent Cooperation Treaty) corresponding to International Application No. PCT/JP2007/057565 dated Dec. 24, 2008.

Oku et al., Carbon nanocage structures formed by one-dimensional self-organization of gold nanoparticles. *Chemical Communications*. pp. 2355-2356 (1999).

Sleytr et al., Crystalline Bacterial Cell Surface Layers (S Layers): From Supramolecular Cell Structure to Biomimetics and Nanotechnology. *Angewandte Chemie International Edition*. vol. 38, No. 8 pp. 1034-1054 (1999).

Teranishi et al., Heat-Induced Size Evolution of Gold Nanoparticles in the Solid State. *Advanced Materials*. vol. 13, No. 22 pp. 1699-1701 (2001).

Teranishi et al., Planar Array of 1D Gold Nanoparticles on Ridge-and-Valley Structured Carbon. *Journal of the American Chemical Soceity*. vol. 124, No. 16 pp. 4210-4211.

Fujiwara et al., "Fabrication of Two-Dimensional Arrays of Gold Nanoparticles Using Phase Segregated Films of Amphiphilic Block Copolymers as Templates," The Chemical Society of Japan. p. 1442 (2005).

International Search Report corresponding to International Patent Application No. PCT/JP2007/057565 dated Jul. 17, 2007.

Spatz et al., "Gold Nanoparticles in Micellar Poly(styrene)-b-Poly-(ethylene oxide) Films—Size and Interparticle Distance Control in Monoparticulate Films," Advanced Materials. vol. 8, No. 4 pp. 337-340 (1996).

Watanabe et al., "Fabrication of Two-Dimensional Arrays of Gold Nanoparticles Using Phase-Separated Amphiphilic Block Copolymer Films as Templates," The Japan Society of Applied Physics. vol. 3 p. 1300 (2006).

* cited by examiner

SUBSTRATE WITH MICROMETALLIC MASSES ALIGNED ON THE SURFACE

FIELD OF THE INVENTION

The present invention relates to a substrate with micrometallic masses on its surface wherein the size and shape of the micrometallic masses are controlled and to a process for preparing the same.

PRIOR ART

Metal nanoparticles with particle diameters of from several nanometers to several tens of nanometers have unusual physical and chemical properties, which are not observed in bulk size due to quantum size effects. When such metal nanoparticles are aligned in an orderly manner, aggregates with new functions hitherto not associated with individual particles are realized. Such aggregates have potential utility in plasmonics elements such as nano optical antennas as well as optical nano circuits. That is, the technology used to prepare and organize metal nanostructures, the size and shape of which are controlled, is the foundation for the nano electronics and plasmonics.

As the technology used to prepare such fine structures, top-down processes to prepare nanostructures using semiconductor processing technologies such as photo lithography, electron beam exposure, X-ray exposure and the like and bottom-up processes using a metal nanoparticle self organization process (Patent reference 1 and Non-patent reference 1), template methods in which orderly structures voluntarily formed by organic and inorganic materials are cast and the like are available. As far as examples of the latter are concerned, methods in which aluminum oxide cathodes (Patent reference 2, Non-patent references 2 and 3), thin amorphous carbon films (Non-patent reference 4), sodium chloride single crystals (Patent reference 3 and Non-patent reference 5), biopolymers (Non-patent references 6 and 7) and the like are used as casting forms have been reported.

Patent reference 1: Japanese Patent Application Public Disclosure No. 2005-225887
Patent reference 2: Japanese Patent Application Public Disclosure No. 2005-195440
Patent reference 3: Japanese Patent Application Public Disclosure No. 2004-098246
Non-patent reference 1: Adv. Mater. 2001, 13, 1699-1701
Non-patent reference 2: Chem. Eur. J. 1997, 3, 1951-1956
Non-patent reference 3: Chem. Lett. 2005, 34, 508-509
Non-patent reference 4: Chem. Commun. 1999, 2355-2356
Non-patent reference 5: J. Am. Chem. Soc. 2002, 124, 4210-4211
Non-patent reference 6: J.E. Adv. Mater. 2001, 13, 109-113
Non-patent reference 7: Angew. Chem. Int. Ed. 2002, 38, 1034-1054

Problems to be Solved by the Invention

Metal nanostructures in which metal masses whose size is in the deca nano region are aligned on a substrate are extremely difficult to produce inexpensively using a top-down microprocessing technology such as semiconductor processing technologies and the like. In contrast, bottom-up technologies used to integrate molecules and particles have an advantage as far as production cost is concerned since they can be used to prepare large volumes of such structures inexpensively. However, inorganic templates are not easy to prepare and decompose after they are used and organic templates that are more readily available lack dependability due to structural disarray and defects generation. Therefore, the development of an industrial manufacturing technology utilizing an organic template of excellent dependability is urgently needed.

The objective of the present invention is to present a metal nanostructure having metal masses with zero valence aligned on a substrate surface wherein the size and shape of the metal masses are controlled and a manufacturing process thereof.

Means to Solve the Problems

A micro phase separation membrane (Patent reference 3) formed using an amphiphilic block copolymer developed by a group of the inventors can assume a state containing numerous hydrophilic micro diameter cylinders inside the membrane in the direction perpendicular to the membrane surface. The inventors discovered that metal ions are localized in the hydrophilic micro diameter cylinders in a micro phase separation membrane when the film is formed using a solution containing an amphiphilic block copolymer and desired metal ions or when a micro phase separation membrane of the amphiphilic block copolymer is formed and subsequently brought in contact with a solution containing the metal ion. The metal ion localized in the hydrophilic micro diameter cylinders is reduced and the micro phase separation membrane is removed to form dot-shaped (or sphere-shaped) or pillar-shaped (or cylinder-shaped) metal masses of zero valence on the substrate when a treatment to reduce the micro phase separation membrane and a treatment to remove the organic material including the micro phase separation membrane is conducted (See Examples described later.). The inventors discovered that a substrate containing numerous zero valence metal masses that are aligned at set intervals on the substrate surface was obtained when the metal masses are in the approximate shapes of pillars, dots or combinations thereof with the pillars oriented in a direction approximately perpendicular to the surface. The present invention was completed based on the discovery.

That is, the present invention is a substrate with micrometallic masses aligned on its surface, which is prepared by subjecting a micro phase separation membrane comprising an amphiphilic block copolymer containing metal ions localized in its hydrophilic segment to a reduction treatment and then to a treatment to remove the organic materials including the micro phase separation membrane, wherein the substrate contains numerous zero valence fine metal masses aligned on its surface at intervals 10 nm to 50 nm wherein the masses are pillar-shaped (i.e. pillars) or dot-shaped (i.e. dots) or a combination thereof and have diameters of 3 nm to 15 nm wherein the pillar-shaped masses are oriented in a direction substantially perpendicular to the surface.

In addition, the invention is a process for preparing a substrate with micrometallic masses aligned on its surface, wherein the substrate contains numerous zero valence fine metal masses aligned on the surface at intervals 10 nm to 50 nm wherein the masses are pillar-shaped or dot-shaped or a combination thereof and have diameters of 3 nm to 15 nm wherein the pillar-shaped masses are oriented in a direction substantially perpendicular to the surface, wherein the process comprises the steps of (a-1) cast coating a solution containing an amphiphilic block copolymer and a metal ion on a substrate, or (a-2) preparing a micro phase separation membrane of an amphiphilic block copolymer on a substrate and then exposing the membrane to a solution containing metal ions, (b) drying the membrane to form a micro phase separation membrane with the metal ions localized in its hydrophilic segment, and (c) subjecting the micro phase separation membrane to a reduction treatment and then subjecting the membrane to a treatment to remove organic materials including those in the micro phase separation membrane.

Advantages of the Invention

The films for preparing the metal nanostructures of the present invention make it possible to form metal nano dots or nano pillars on a broad range of optional substrates without regard to shape or to the material of construction and present a foundation material and a foundation technology on which to build nano electronics and plasmonics.

DETAILED DESCRIPTION OF THE INVENTION

Figure 1:
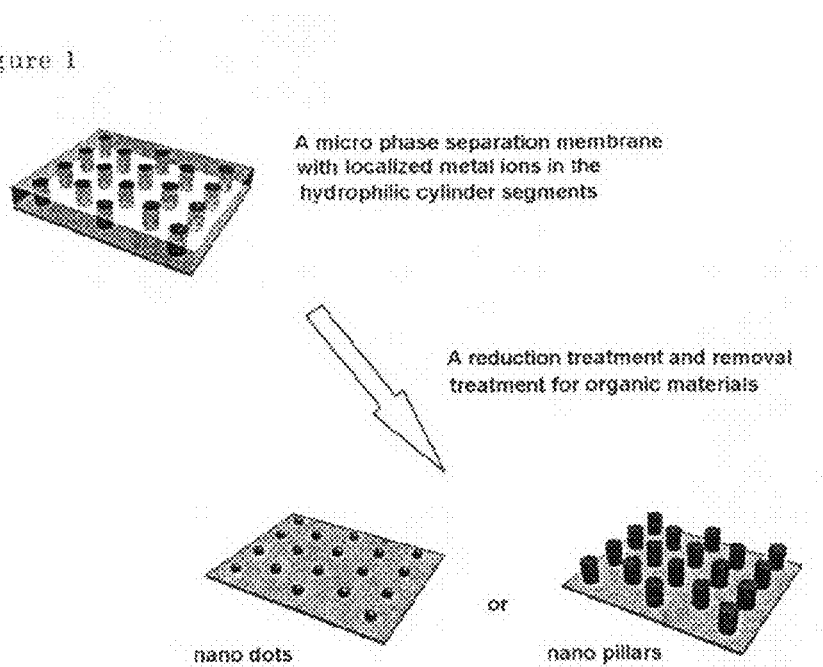
FIG. 1 shows the method for preparing a substrate of the present invention wherein fine metal masses are lined in an orderly manner on the surface.

The micro phase separation membrane used in the present invention contains numerous approximately circular hydrophilic cylinders with a diameter from 3 nm to 15 nm in the membrane oriented in the direction perpendicular to the membrane surface and spaced at 10 nm to 50 nm intervals and comprises an amphiphilic block copolymer containing localized metal ions in the hydrophilic segments.

The amphiphilic block copolymer is a block copolymer obtained by bonding incompatible polymers, a hydrophilic polymer component (A) and a hydrophobic polymer component (B), using a covalent bond, and molecular weight distributions (Mw/Mn) for the hydrophilic polymer component (A) and the hydrophobic polymer component (B) of 1.3 or less are preferred.

Based on the quantitative relationship between the hydrophilic and hydrophobic components, the hydrophilic component is thought to constitute a domain region (cylinder like domain) and the hydrophobic component is thought to constitute a matrix region. The thickness of the membrane formed is ordinarily about 50 nm to 1 μm.

The molecular weight distribution (Mw/Mn) refers to a value calculated from the weight average molecular weight, Mw, and the number average molecular weight, Mn, measured using gel permeation chromatography and calculated in reference to polystyrene.

The molecular weight of the block copolymer described above is preferably from 5,000 to 100,000 and more preferably from 10,000 to 50,000.

As the hydrophilic polymer component (A) described above, poly(ethylene oxide), poly(propylene oxide), poly(vinyl alcohol), poly(acrylic acid), poly(methacrylic acid), poly(acrylamide), oligo(ethylene oxide), crown ether and poly(methacrylate) or poly(acrylate) and the like containing cryptand and sugar chains on the side chain, for example, may be cited.

In addition, as the hydrophobic polymer component (B) described above, poly(methacrylate), poly(acrylate), polystyrene, vinyl polymers and the like containing mesogene side chains, long chain alkyl side chains or hydrophobic side chains, for example, may be cited. Mesogene side chains refer to strongly oriented molecular chains such as liquid crystalline molecules.

Amphiphilic block copolymers represented by the general formula (1) below are preferred.

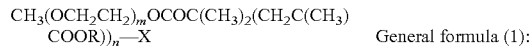

General formula (1): $CH_3(OCH_2CH_2)_mOCOC(CH_3)_2(CH_2C(CH_3)COOR))_n$—X (In the formula, m and n may be identical to each other or different and are each integers from five to five hundred, R is a substituent represented by the general formulae (2) and (3) shown below and X represents a hydrogen atom or a halogen atom.)

General formula (2): —$CH_2(CH_2)_aCH_2O$—B—N═N—B—$R^1$ (In the formula, a is an integer zero to twenty, $R^1$ is a hydrogen or an alkyl group with one to twenty-two carbon atoms, and B represents a p-phenylene group.)

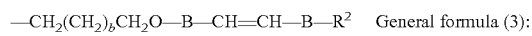

General formula (3): —$CH_2(CH_2)_bCH_2O$—B—CH═CH—B—$R^2$ (In the formula, b is an integer zero to twenty, $R^2$ is a hydrogen or an alkyl group containing one to twenty-two carbon atoms, and B represents a phenylene group.)

The metal ions used in the present invention are not particularly restricted, but the ions of copper group metals and platinum group metals can be used. As the copper group metals, Ag and Au may be cited, and Pt, Pd, Rh, Ir, Ru and Os may be cited as platinum group metals. They may be used individually or as a mixture thereof. These metal ions are suited for the objective of the invention of this application since they have very low ionization tendency and are chemically stable allowing them to be readily reduced.

The metal ions may be formed by dissolving metal precursors in a solvent, and metal salts are preferred as the precursors.

Examples of such metal salts are cited below.

As a gold salt, those containing $Au^+$, $Au^{+3}$ or $Au^{4+}$ may be cited. Those represented by $Au^IX$, $Au^{III}X_3$, $M[Au^{IV}X_6]$ (in the formula, X represents a negative ion, $Cl^-$ or $CN^-$, and M represents a monovalent cation $Na^+$, $K^+$ or $H^+$) may be used, and AuCN, $AuCl_3$, $HAuCl_6$, $NaAuCl_6$, $KAuCl_6$, $Au_2O_3$ and the like, for example, may be cited.

As a silver salt, those containing $Ag^+$ may be cited. Those represented by $Au^1X$ (in the formula X represents a negative ion, $F^-$, $Cl^-$, $Br^-$, $I^-$, $CN^-$, $SCN^-$, $NO_3^-$, $PF_6^-$, $CO_3^-$, $ClO_4^-$, $SO_4^{2-}$, $acac^-$, $CH_3CO^{2-}$, $CF_3CO^{2-}$, $CF_3SO_3^-$, $O^-$, $O^{2-}$, $S^-$, $PO_4^{3-}$ or $IO_3^-$) may be used, and AgF, AgCl, AgBr, AgI, AgCN, AgSCN, $AgNO_3$, $AgPF_6$, $Ag_2CO_3$, $AgClO_4$, $Ag_2SO_4$, acacAg, $CH_3CO_2Ag$, $CF_3CO_2Ag$, $CF_3SO_3Ag$, AgO, $Ag_2O$, $Ag_2S$, $Ag_3PO_4$, $AgIO_3$, $AgSbF_6$, $AgAsFs$, $Ag_8W_4O_{16}$ and the like, for example, may be cited.

As a platinum salt, those containing $Pt^{2+}$ $Pt^{3+}$ and $Pt^{4+}$ may be cited. Those represented by $PtX_2$, $PtX_3$, $PtX_4$, $[PtA_6]X_2$, $M^1_2[PtX_4]$, $M^1_2[PtX_2Y_2]$, $M^1[PtX_3Y]$, $M^1[X_2Y_2]$, $M^1_2[PtX_6]$ (in the formula x and Y are each negative ions such as $F^-$, $Cl^-$, $Br^-$, $I^-$, $OH^-$, $CN^-$, $NO_3^-$, $N^{3-}$, $CH_3COO^-$, $SCN^-$, acetylacetonate, $1/2\ SO_4^{2-}$, $1/2CO_3^{2-}$ and the like, $M^1$ is a monovalent cation such as K, Na, H and the like, A is $NH_3$ or an amine) may be used, and $PtCl_2$, $PtBr_2$, $PtI_2$, $Pt(CN)_2$, $Pt(SCN)_2$, $PtCl_3$, $PtBr_3$, $PtI_3$, $PtF_4$, $PtCl_4$, $PtBr_4$, $PtI_4$, $K_2[PtCl_2(acac)_2]$, $H_2PtCl_6$ and the like, for example, may be cited.

As a ruthenium salt, those containing $Ru^{2+}$, $Ru^{3+}$ or $Ru^{4+}$ may be cited. Those represented by $RuX_2$, $RuX_3$, $RuX_4$, $[RuX_6]M^1_3$, $M^1[RuX_4]$ (in the formula x is a halogen such as Cl, Br and the like or an anion such as $NO_3^-$, $SO_4^{-2}$ and the like and $M^1$ is a monovalent cation such as K, Na, Rb, Cs, H and the like) may be used, and $RuCl_3$, $(NH_4)_2RuCl_6$, $Ru(SO_4)_2$, $RuS_2$, $RuO_2$, $RuO_4$, $Na_2RuO_4$, $K_2RuO_4$ and the like, for example, may be cited.

As an iridium salt, those containing $Ir^+$, $Ir^{2+}$, $Ir^{3+}$ or $Ir^{4+}$ may be cited. Those represented by IrX, $IrX_2$, $IrX_3$, $IrX_4$, $[IrX_6]M^1_3$, $M^1[IrX_4]$ (in the formula X is a halogen such as Cl, Br and the like or an anion such as $SO_4^{-2}$ and $M^1$ is a monovalent cation such as K, Na, Rb, Cs or H and the like) may be used, and $KIr(SO_4)_2$, $RbIr(SO_4)_2$, $CsIr(SO_4)_2$ and the like, for example, may be cited.

As a palladium salt, those containing $Pd^{2+}$ may be cited. Those ordinarily represented by $Pd-Z_2$ (in the formula Z is a halogen such as Cl, Br, I and the like or a salt such as acetate, trifluoroacetate, acetylacetonate, carbonate, perchlorate, nitrate, sulfate, oxide and the like) may be used, and $PdCl_2$, $PdBr_2$, $PdI_2$, $Pd(OCOCH_3)_2$, $Pd(OCOCF_3)_2$, $PdSO_4$, $Pd(NO_3)_2$, PdO and the like, for example, may be cited.

As an osmium salt, those containing $Os^+$, $Os^{2+}$, $Os^{3+}$ or $Os^{4+}$ may be cited. Those represented by OsX, $OsX_2$, $OsX_3$, $OsX_4$, $[OsX_6]M^1_3$, $M^1[OsX_4]$ (in the formula X is a halogen such as Cl, Br and the like or an anion such as $SO_4^{-2}$ and $M^1$ is a monovalent cation such as K, Na, Rb, Cs or H and the like) may be used, and $OsBr_4$, $OsO_4$, $OsCl_4$, $Kos(SO_4)_2$, $RbOs(SO_4)_2$, $CsOs(SO_4)_2$ and the like, for example, may be cited.

As a rhodium salt, those containing $Rh^{3+}$ may be cited. Those represented by $RhX_3$, $Rh_2X_6$, $[RhA_6]X_3$, $M^1_3[RhX_6]$, $M^1[RhX_4]$ (in the formula x is a halogen such as F, Cl and the like or an anion such as CN, $SO_4$ and the like and $M^1$ is a monovalent cation such as K, Na, H and the like and A is $NH_3$ or an amine) may be used, and $Rh_2O_3$, $RhO_2$, $Rh_2(SO_4)_3$, $Rh(OH)_3$, $Rh(NO_3)_3$, $RhCl_3$, $RhF_3$, $RhCN_3$, $KRh(SO_4)_2$, $Na_2RhCl_4$, $NaRh(SO_4)_2$, $HRh(SO_4)_2$ and the like, for example, can be cited.

Next, a method to manufacture a substrate containing lines of fine metal masses on the surface is described. The substrate can be prepared using two methods.

A micro phase separation membrane is ordinarily prepared by dissolving the amphiphilic block copolymer described above in a solvent and forming a membrane. In this method, however, a precursor of the metal ions described above is dissolved in a solvent, and a solution obtained by dissolving an amphiphilic block copolymer and the metal ions in a solvent are used to form a membrane.

As a separate method, a membrane is formed on a substrate using a solution of an amphiphilic block copolymer to obtain a micro phase separation membrane. The membrane, for example, is annealed in vacuum at 140° C. for twenty-four hours to prepare a highly orderly nano phase separation membrane. By impregnating the membrane in a metal salt solution, a micro phase separation membrane containing localized metal ions in the hydrophilic cylinder segments is prepared.

As the solvent that can dissolve or disperse the metal salt, water; ketones such as acetone and methyl ethyl ketone; esters such as ethyl acetate; alcohols such as methanol and ethanol; and non-protonic polar solvents such as dimethyl formamide, dimethyl sulfoxide, sulfolane, diglyme and hexamethyl phosphoric acid triamide as well as nitromethane, acetonitrile and the like may be cited. The use of water or a mixture of water and a hydrophilic organic solvent such as alcohols and ketones that blend with water is preferred.

Poly(ethylene glycol) (PEG), polyvinylpyrolidone (PVP) and the like may also be added as needed to the solution.

The metal salt concentration ordinarily used is from 0.001% to saturation. When the solvent is water, from 0.01% to 20% is preferred and from 0.1% to 5% is more preferred.

The amount of metal ions used per block copolymer is set so that the molar ratio (EO/M) for the metal ion (M) to the ethylene oxide monomer (EO) constituting the poly(ethylene oxide) chain of the block copolymer is from one to one thousand and preferably from one hundred to five hundred. Dots or pillars are ideally formed when the ratio is within this range.

Next, the solution is used to prepare a membrane. When an amphiphilic block copolymer of the present invention is used, the hydrophilic domain and the hydrophobic domain separate through self aggregation. The positioning through self aggregation is preferably promoted by allowing the domains to self aggregate in the solution or by applying heat.

More specifically, a membrane can be prepared by dropping a solution containing an amphiphilic block copolymer dropwise onto a substrate or by casting the solution into a die. As specific membrane forming processes, spin coating, casting, bar coating, micro gravure and the like may be used.

Smooth substrates are preferred as the substrate, and mica sheets, silicone wafers and the like, for example, may be used.

After applying a coating, a membrane is formed under the following conditions. The solvent is removed at room temperature under ambient pressure or reduced pressure. Furthermore, a better ordered nano phase separation membrane can be prepared upon annealing the membrane at ambient or reduced pressure at a temperature of the isotropic point plus no more than 10° C. for at least several hours (ordinarily for one to two days).

Figure 2:
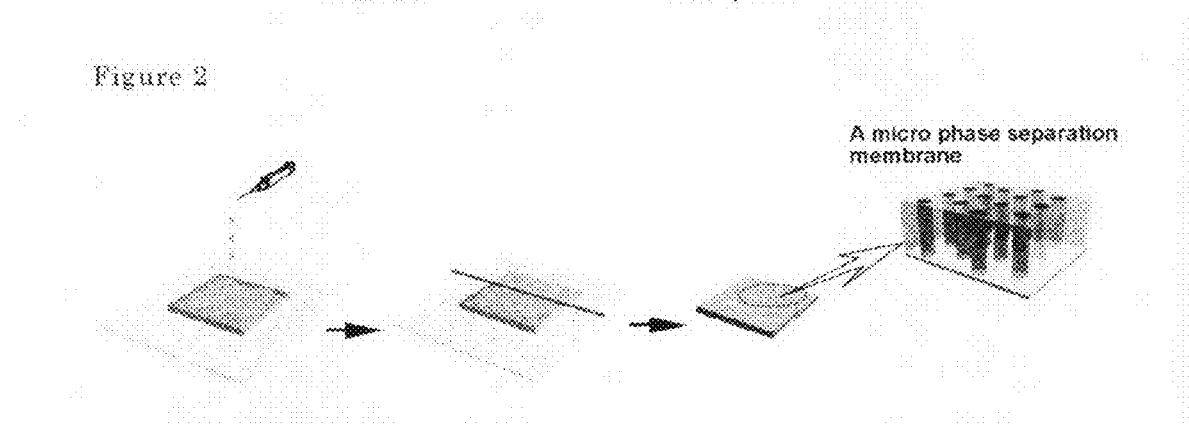
FIG. 2 shows the mode in which a micro phase separation membrane is formed.

When an amphiphilic block copolymer of general formula (1) is used, a membrane or a film about 50 nm to 1 μm thick and about several square meters in size can be obtained. The process is described in FIG. 2.

As a result, the metal ions are localized in the cylinder section (hydrophilic zone) of the micro phase separation membrane. The result is attributed to non-covalent bonding derived from Van der Waals forces, dipole-dipole interactions, static attraction and the like. The bonding force is weak, and the metal ions are not always selectively bonded to the hydrophilic cylinder zones when, for example, the dispersion concentration is too high.

Therefore, the metal ion concentration is preferably suitably adjusted so that a desired occupancy ratio (the proportion with which micells are bonded to the domain region) can be attained. Similar considerations are desired for other conditions (impregnation time, temperature, rotations number and the like).

Next, a micro phase separation membrane obtained in the manner described above may be laminated on a substrate. A substrate that is oxidized with difficulty by ozone ($O_3$) is preferred, and silicone wafers, glass, metal and the like, for example, may be used as substrates. This operation may be eliminated if a suitable substrate is used in the process described above.

Next the metal ions localized in the cylinders in a micro phase separation membrane are reduced, and the organic materials including the micro phase separation membrane are removed. The reduction and organic material removal treatments are preferably conducted in one step, but a treatment conducted by employing multiple steps may also be used.

As the treatment, ultraviolet light irradiation or electron beam irradiation, plasma treatments, chemical reduction processes and electrochemical reduction processes may be cited. Of these, ultraviolet light irradiation, particularly vacuum ultraviolet light irradiation, is preferred. Examples are described below.

(1) Ultraviolet Light Irradiation

The metal ions in a membrane are excited when a sample (a micro phase separation membrane containing metal ions) under ambient pressure is irradiated with ultraviolet light (wavelength: from about 1 nm to 400 nm) and are reduced by the surrounding membrane components.

The use of vacuum ultraviolet light (wavelength: about 200 nm or shorter) for the ultraviolet light irradiation is preferred since it allows the reduction treatment and the organic material removal treatment to be conducted in one step. The oxidation power of the metal cations excited by the vacuum ultraviolet light oxidation increases, and the ions are thought to be reduced upon receiving electrons from the membrane components in the surrounding areas or upon receiving electrons from decomposition products when the membrane is decomposed upon vacuum ultraviolet light irradiation to yield zero valence metal masses. An eximer lamp or an eximer laser may preferably used as the light source, and the wavelength range is from about 170 nm to 260 nm.

The irradiation subject and the light source are placed under ambient pressure or vacuum (120 Pa to 1,200 Pa), and organic materials including the micro phase separation membrane are removed using vacuum ultraviolet light irradiation. The organic materials or their decomposition products are vaporized, and evacuation at a rate of from 1 liter/min to 100 liters/min is preferred to maintain the degree of vacuum at about 120 Pa to 1,200 Pa).

Metal ions are similarly reduced when ultraviolet light radiation with wavelengths of from 200 nm to 400 nm is used, but an etching treatment to remove organic materials needs to be conducted separately. As such an etching treatment, the micro phase separation membrane is, for example, eluted following the ultraviolet light irradiation using a solvent such as water, ethanol, toluene, methylene chloride and the like. A high pressure mercury lamp, xenon lamp and the like may be used as the ultraviolet light source in these cases.

(2) Electron Beam Irradiation

When a sample (a micro phase separation membrane containing metal ions) is placed under ambient pressure (in an inert gas atmosphere such as nitrogen and the like) or in vacuum and irradiated using electron beam at a low acceleration voltage (75 kV or lower), the metal ions are reduced and the membrane is decomposed due to the interaction (electrolytic dissociation-excitation) between metal ions and membrane components to form dots and pillars on the substrate.

(3) Plasma Treatment

A reaction gas such as $O_2$, $N_2$, $H_2$, $CF_4$, $CHF_3$, $BCl_3$, $SiCl_3$, $SF_6$ and the like is introduced under reduced pressure into a reaction chamber in which a sample (a micro phase separation membrane containing metal ions) is placed, and a plasma is generated by applying a high frequency electrical field or the like. The reaction gas is excited, dissociated or electrolytically dissociated to activate it through non-elastic collisions of electrons in the plasma, and the radicals, ions and the like formed reach the sample and are diffused inside the sample to reduce the metal ions to form dots and pillars. Simultaneously, the membrane is dissipated in the form of highly volatile reaction products.

As the plasma source, parallel planar type, two cycle parallel planar type, magnetron type, electron cyclotron plasma (ECR), induction coupled plasma (ICP), surface wave plasma (SWP) and the like may be cited.

In addition, reactive ion beam (RIB) and focused ion beam (FIB) methods that aggressively utilize activated ions are also useful.

(4) Chemical Reduction Process

A micro phase separation membrane containing metal ions is impregnated at room temperature in a solution of a reducing agent such as sodium borohydrate ($NaBH_4$), sodium thiocyanurate (NaSCN) and the like. The reducing agent penetrates into the hydrophilic sections of the membrane, and the metal ions inside the hydrophilic sections are reduced. The membrane is subsequently gradually eluted, and dots and pillars are formed on the substrate.

(5) Electrochemical Reduction Process

After a micro phase separation membrane containing metal ions is formed on an anode, an electrical field is applied in an electrolyte solution obtained by dissolving an electroconductive salt that does not cause electrical decomposition at the applied potential of the salts of alkali metals or alkaline earth metals, tetralkyl ammonium salts and the like. The metal ions inside the micro phase separation membrane form dots and pillars on the reduced electrode.

In addition, the metal ion precursors sometimes contain inorganic anions such as $F^-$, $Cl^-$, $Br^-$, $I^-$, $OH^-$, $CN^-$, $NO_3^-$, $N_3^-$, $SCN^-$, $SO_4^{2-}$, $CO_3^{2-}$, acetate, trifluoroacetate, acetylacetonate, carbonate, perchlorate, nitrate, sulfate, oxide and the like or inorganic cations such as $K^+$, $Na^+$, $Rb^+$, $Cs^+$, $NH^{4+}$ and the like as described above. After they are converted into highly volatile compounds they are thought to be removed in the organic material removal step and naturally dissipated or removed upon dissolving in the reducing solution. However, they may be subsequently removed using a washing process if they remain on the substrate.

As shown in FIG. 1, only zero valence metal remains, as a result, in the location corresponding to the cylinder segments of the micro phase separation membrane on a substrate. The shape of the remaining metal masses is the same shape as the hydrophilic cylinders in the micro phase separation membrane or the shape obtained through shrinkage or deformation upon decomposition and removal of the micro phase separation membrane. In addition, the shape may be different depending upon the concentration of the metal present in the cylinder section. The shape is thought to be cylinder-shaped when the concentration is high, and the shape is thought to be sphere-shaped when the concentration is low.

As a result, a substrate with numerous fine metal masses lined neatly on the surface at 10 nm to 50 nm intervals wherein the masses have shapes that are approximately pillar-shaped (i.e. pillars), approximately dot-shaped (i.e. dots) or a combination of these with diameters of from 3 nm to 15 nm and the pillars are oriented in a direction substantially perpendicular to the surface can be obtained.

The present invention is explained below using examples, but the examples are not provided to limit the present invention.

PRODUCTION EXAMPLE 1

Poly(ethylene oxide) methyl ether (molecular weight 5,000) with a degree of polymerization (m) of one hundred and fourteen was used as the hydrophilic polymer chain and was allowed to undergo block copolymerization with benzene methacrylate containing azo groups having hydrophobic and liquid crystalline properties to synthesize an amphiphilic block copolymer with a degree of polymerization (n) of fifty-one. The synthesis was conducted using an atom transfer radical polymerization method and a copper complex as the catalyst.

The amphiphilic block copolymer obtained is represented by the general formula (Chemical Formula 1) shown below.

[Chemical Formula 1]

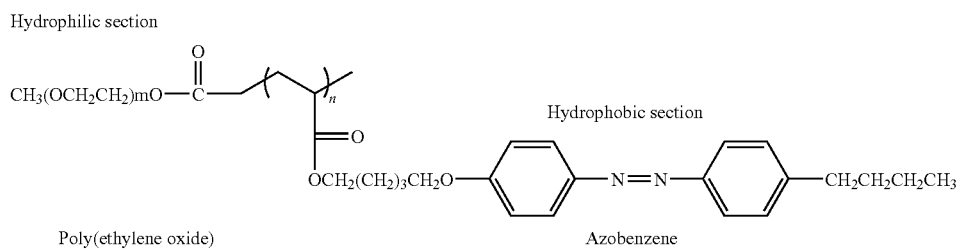

The number average molecular weight of the copolymer obtained was 30,000, Mw/Mn=1.23, the polymethacrylate (MA) content was 83% by weight and the melting point was 120° C. (Henceforth referred to as "PEO114-b-PMA(Az) 51".)

PRODUCTION EXAMPLE 2

Poly(ethylene oxide) methyl ether (molecular weight 12,000) with a degree of polymerization (m) of two hundred and seventy-two was used as the hydrophilic polymer chain in the manner described in Production Example 1, and was allowed to undergo block copolymerization with benzene methacrylate containing azo groups having hydrophobic and liquid crystalline properties to synthesize an amphiphilic block copolymer with a degree of polymerization (n) of seventy-four. The synthesis was conducted using an at om transfer radical polymerization method and a copper complex as the catalyst. The number average molecular weight of the copolymer obtained was 48,400, Mw/Mn=1.10, the poly-methacrylate (MA) content was 75% by weight and the melting point was about 120° C. (Henceforth referred to as "PEO272-b-PMA(Az)74".)

PRODUCTION EXAMPLE 3

MA(11Az4) 7.38 g (15 mmoles), $PEO_{272}$-BMP 1.716 g (0.143 mmole) as the polymerization initiator and fluorinated resin agitation pieces were added to a 100 ml pear shaped flask with a ground glass neck. The flask along with Cu(I)Cl 63.7 mg (0.643 mmole) in a sample bottle were subjected to three repetitions of nitrogen gas flushing and gas removal at the entrance to a vacuum glove box before they were placed in a glove box. Inside the box, 50 ml of de-gassed anisole ($[M_o]$= 0.25M) was weighed. A micro syringe was used to add 174.7 μl (148.0 mg, 0.643 mmole) of de-gassed HMTETA to the Cu(I)Cl in the sample bottle. A pale green copper complex was formed by adding and dissolving a small amount of the weighed anisole. The copper complex solution and the remaining anisole were added to the pear shaped flask, vacuum grease was applied to a ground glass stopper and the ground glass stopper was used to seal the flask. The pear shaped flask was removed from the glove box, and polymerization was allowed to occur for several tens of hours at 80° C.

The polymerization was concluded by opening the pear shaped flask stopper and deactivating the complex by exposing it to air. The solvent was removed using an evaporator. The solids obtained were dissolved in about 50 ml of chloroform, and the copper complex was removed using 200 ml of 1N HCl in four portions and a 500 ml separatory funnel. Next, 5% $NaHCO_3$ was used four times to neutralize the solution and to confirm the copper complex removal. Lastly, 200 ml of saturated aqueous salt solution (BRAIN) was used once to remove water from the solution. The chloroform solution upon completion of the separation was placed in a 100 ml beaker and was dried by allowing it to stand for an hour after adding magnesium sulfate. The dried chloroform solution was filtered to remove magnesium sulfate. At this point, magnesium sulfate was washed using chloroform until it was white, and the filtrate was treated using an evaporator to remove the solvent. The white solids obtained were washed using boiling hexane to remove unreacted monomer. The washing operation using boiling hexane was assisted by GPC measurements and was repeated until the peak attributed to the monomer disappeared. The solids were dried inside a desiccator to obtain an amphiphilic block copolymer. The number average molecular weight of the copolymer obtained was 62,200, Mw/Mn=1.10, the polymethacrylate (MA) content was 75% by weight and the melting point was about 120° C. (Henceforth referred to as "PEO272-b-PMA(Az)102".)

PRODUCTION EXAMPLE 4

MA (11Stb4) 491 mg (10 mmoles), $PEO_{114}$-BMP 714.3 mg (0.143 mmole) as the polymerization initiator and fluorinated resin agitation pieces were added to a 100 ml pear shaped flask with a ground glass neck. The flask along with Cu(I)Cl 84.9 mg (0.857 mmole) in a sample bottle were subjected to three repetitions of nitrogen gas flushing and gas removal at the entrance to a vacuum glove box before they were placed in a glove box. Inside the box, 40 ml of de-gassed anisole ([M$_o$]=0.25M) was weighed. A micro syringe was used to add 233 μl (197 mg, 0.857 mmole) of de-gassed HMTETA to the Cu(I)Cl in the sample bottle. A pale green copper complex was formed by adding and dissolving a small amount of the weighed anisole. The copper complex solution and the remaining anisole were added to the pear shaped flask, vacuum grease was applied to a ground glass stopper and the ground glass stopper was used to seal the flask. The pear shaped flask was removed from the glove box, and polymerization was allowed to occur for sixty hours at 190° C.

The stopper in the pear shaped flask was opened, and the polymerization was concluded by exposing the complex to air to deactivate the complex. MA(Stb) was slightly soluble in the solvent at ambient temperature, and the solution obtained was warmed to about 40° C. A neutral alumina column (Φ=30 mm, L=100 mm, developing solvent: THF) was used to remove the copper complex, and the solvent was removed using an evaporator. The white solids obtained were washed using boiling hexane to remove unreacted monomer. The washing operation using boiling hexane was assisted by GPC measurements and was repeated until the peak attributed to the monomer disappeared. The solids were dried in a desiccator to obtain an amphiphilic block copolymer (henceforth referred to as "PEO$_{114}$-b-PMA(Stb)$_{52}$"). [2.36 g, yield 70%, Mn=30,500, Mw/Mn=1.26 (based on GPC), monomer conversion ratio ($^1$HNMR based)=54%]

Figure 3:
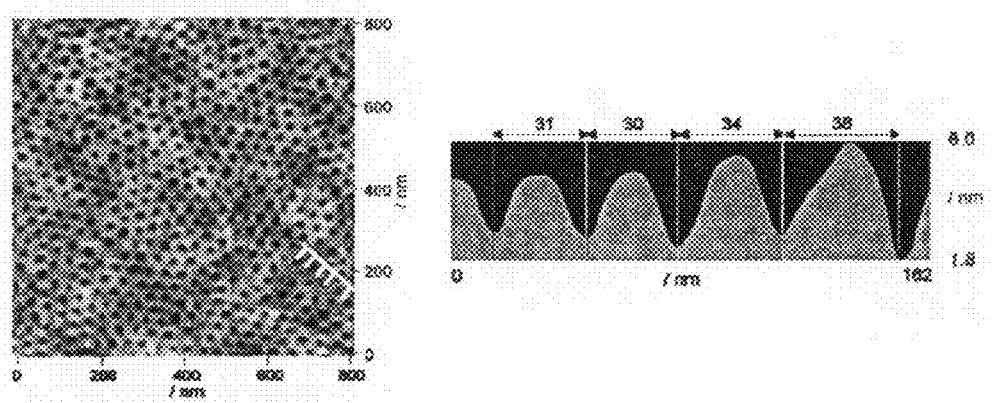
FIG. 3 shows an AFM shape image of a micro phase separation membrane in which gold ions are bonded.

The amphiphilic block copolymer obtained is represented by the general formula (Chemical Formula 2) shown below.

ture. Upon annealing, the nano phase separation membrane was examined using an atomic force microscope (Seiko Instrument Co., SPA400). The results are shown in FIG. 3.

Figure 4:
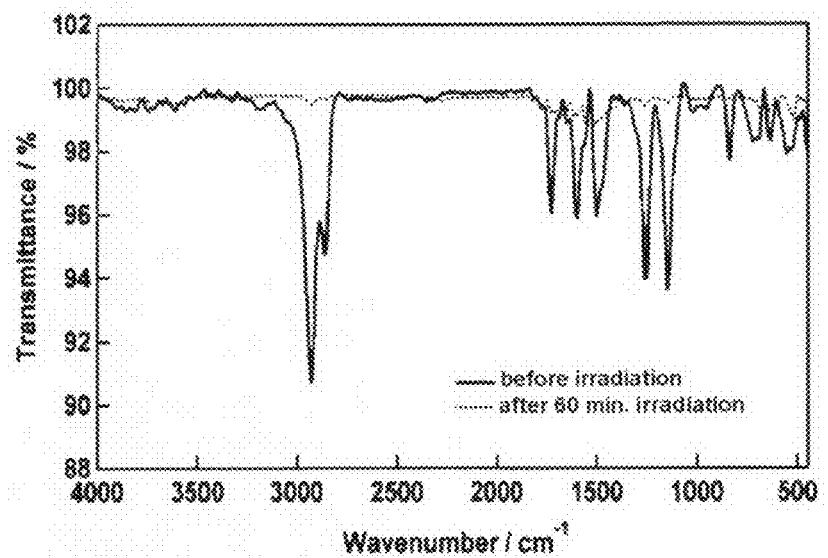
FIG. 4 shows the FT-IR spectra before and after irradiation of vacuum ultraviolet light.

The nano phase separation membrane that had been subjected to gold ion interaction was irradiated for sixty minutes at room temperature under reduced pressure ($1.2 \times 10^3$ Pa) with 172 nm vacuum ultraviolet light from an irradiation distance of 2 mm using a vacuum ultraviolet light irradiation device (Ushio Denki Co., UEM20-172). The membrane was washed using methylene chloride (Wako Junyaku Kogyo) after the irradiation followed by super pure water (18.2 MΩ·cm). The substrate IR spectra before and after the vacuum ultraviolet light irradiation obtained using an FT-IR spectroscope (Nippon Bunko K.K., FT/IR-5300) were examined. The results are shown in FIG. 4.

Figure 5:
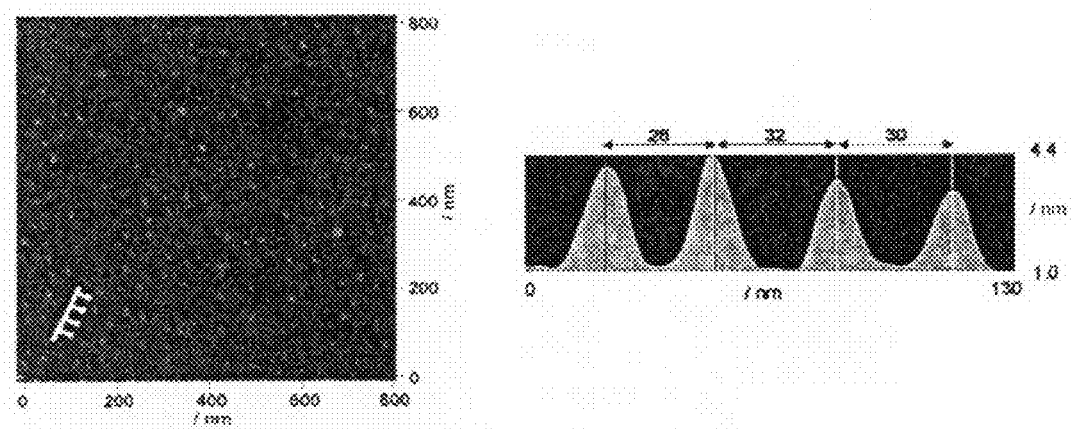
FIG. 5 shows the AFM shape image of the gold nano dots formed on a silicon substrate.

After the membrane was decomposed and removed, the nano gold dots formed on the substrate were examined using an atomic force microscope (AFM) (Seiko Instruments K.K., SPA400). The results are shown in FIG. 5. Highly ordered nano Au dots reflecting PEO114-b-PMA(Az)51 structures 10 nm in diameter and 4 nm high located at about 30 nm cycles were obtained.

Au4f electron peaks were observed at 84 eV in an X-ray photoelectron spectroscope (XPS) evaluation of the substrate surface.

The data indicated that the ozone generated by the vacuum ultraviolet light irradiation decomposed and removed the organic material on the substrate and also reduced the gold ions to metallic gold (zero valence).

EXAMPLE 2

In the example, silver ion (AgNO$_3$) was used to form pillars (or dots) comprising zero valence silver on a silicon substrate.

[Chemical Formula 2]

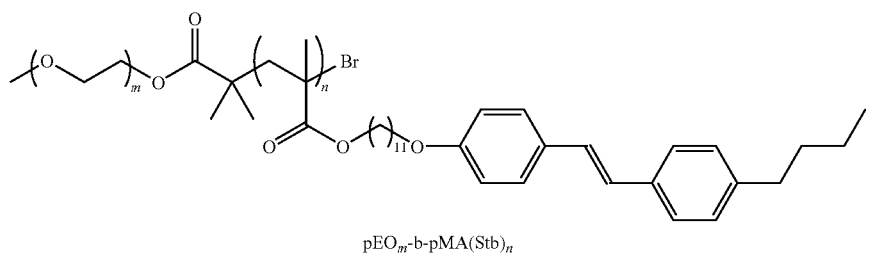

pEO$_m$-b-pMA(Stb)$_n$

EXAMPLE 1

In the example, gold ion (HAuCl$_4$) was used to form pillars (or dots) comprising zero valence gold on a silicon substrate.

Chloroauric acid (Wako Junyaku Kogyo) was added to a 3% by weight tetrahydrofuran solution (50 mg, 1,820 μl) of the amphiphilic block copolymer [PEO114-b-PMA(Az)51] obtained in Production Example 1 to prepare a mixed solution. The gold ion in this case was adjusted so that EO/Au=120 based on the ethylene oxide (EO) constituting the block copolymer.

The mixed solution prepared as described above was filtered using a syringe filter (Whatman Co., opening 0.45 μm), and 100 μl was dropped on a 1 cm×2 cm silicon substrate. A spin coater (MIKADA Corp., 1H-D7) was used at a rotation rate of 2,000 rpm for ten seconds to apply the cast coating.

Figure 6:
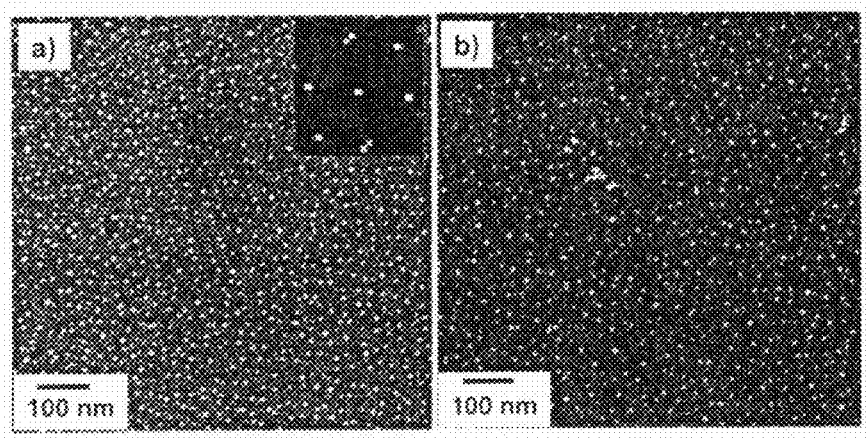
FIG. 6 shows the AFM shape image of the Ag nano dots prepared. Images resulting from (a) using a molar ratio of 20 for EO/Ag$^+$ and (b) using a molar ratio of 120 for EO/Ag$^+$ are shown.

The silicon substrate cast coated with the block copolymer was annealed for twenty-four hours at 120° C. under reduced pressure ($6.7 \times 10^{-2}$ Pa) to form a nano phase separation struc- The PEO114-b-PMA(Az)51 obtained in Production Example 1 and AgNO$_3$ (Wako Junyaku Kogyo) were mixed in toluene to achieve solutions with EO/Ag$^+$ molar ratios of twenty and one hundred and twenty. The 2 w/w % toluene solutions were spin coated on substrates to prepare membranes about 100 nm thick. The membranes were subjected to a heat treatment (annealing) and were subsequently irradiated for thirty minutes using a vacuum ultraviolet light. The results are shown in FIG. 6.

Mock hexagonal nano particles as shown in (a) were observed when the EO/Ag$^+$ molar ratio was twenty. The particle size was 10 nm, and the height was 3 nm. The particles size was 6 nm and the height was 2 nm as seen in (b) when the EO/Ag$^+$ molar ratio was as low as one hundred and twenty. The observation indicated that the dot size was optionally controlled by changing the concentration.

Figure 7:
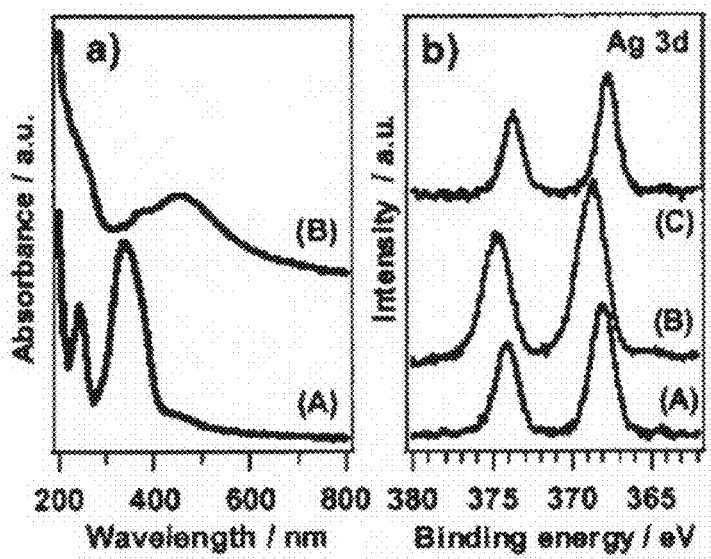
FIG. 7 shows a) UV spectrum and b) XPS spectrum of Ag nano dots formed on a quartz glass substrate. a) (A) A membrane treated with Ag$^+$ and (B) a sample after vacuum ultraviolet light irradiation are shown. b) (A) A membrane treated with Ag$^+$, (B) a sample after vacuum ultraviolet light irradiation and (C) a sample oxidized at 600° C. are shown.

The results of inspecting the properties of Ag particles formed on quartz glass were shown in FIG. 7. The peak (A) attributed to PEO114-b-PMA(Az)51 disappeared as indicated in (a) after vacuum ultraviolet light irradiation, and Ag particle plasmon absorption was observed at 450 nm (B).

Next XPS evaluation was conducted to confirm that the Ag was reduced to zero valence Ag particles (b). The bonding energy increased somewhat upon irradiation (B) when compared to the sample (A) prior to the vacuum ultraviolet light irradiation. When the sample was subjected to a heat treatment at 600° C. in air to oxidize it, the bonding energy declined to the original value (C). The observation indicated that zero valence Ag was formed due to $Ag^+$ reduction through vacuum ultraviolet light irradiation.

EXAMPLE 3

In the example, silver ion ($AgNO_3$) was used to form pillars (or dots) comprising zero valence silver on a silicon substrate.

The PEO114-b-PMA(Az)51 obtained in Production Example 1 was dissolved in toluene to form a 2 w/w % (weight ratio) (molar ratio $6.6 \times 10^{-5}$) solution, and the solution was spin coated on quartz or Si (100) to prepare membranes about 100 nm thick. The membrane was subjected to a heat treatment (annealing) for twenty-four hours at 140° C. under vacuum (25 Pa). An aqueous 1.0 M $AgNO_3$ solution was added dropwise onto the membrane and was left standing for thirty minutes at room temperature. The membrane was subsequently washed using distilled water and dried under vacuum (100 Pa). Samples obtained in the manner described above were irradiated for thirty minutes using 172 nm vacuum ultraviolet light under reduced pressure (50 Pa).

Figure 8:
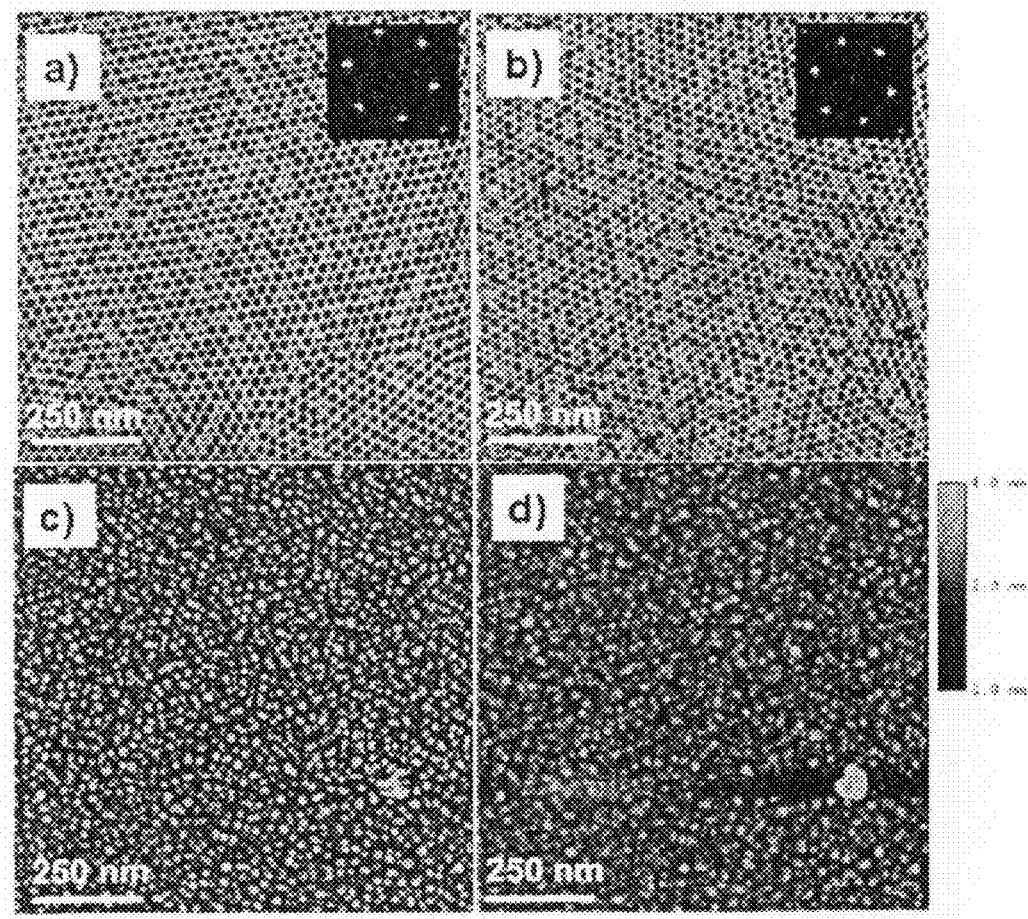
FIG. 8 shows an AFM shape image of Ag nano dots. a) shows the membrane before a treatment, b) shows the membrane after a treatment, c) shows the topological image after a vacuum ultraviolet light irradiation and d) shows the height image.

The results obtained with AMF when a silicon substrate was used are shown in FIG. 8. (a) is the membrane prior to the treatment, and (b) is the membrane treated with $Ag^+$. (c) is the topological image of the membrane after vacuum ultraviolet light irradiation, and (d) is the height image. (a) indicated that the block polymer had a cycle of 20 nm and a PEO cylinder diameter of 10 nm. (b) indicated that $Ag^+$ was selectively ligand bonded to the PEO segments, and its construction was not changed by the treatment. After the vacuum ultraviolet light irradiation, PEO114-b-PMA(Az)51 was completely removed (confirmed by infrared spectroscopy), and highly ordered AgO nano dots reflecting a PEO114-b-PMA(Az)51 structure with a cycle of about 18 nm, particle diameter of 8 nm and height of 3 nm were obtained.

EXAMPLE 4

In the example, palladium ion (palladium acetate) was used to form pillars (or dots) comprising zero valence palladium.

The amphiphilic block copolymer, PEO272-b-PMA(Az)74, obtained in Production Example 2 was used to prepare a 3.0% by weight toluene solution, and palladium acetate, $Pd(acac)_2$, was used to prepare a 0.5% by weight toluene solution. The solutions were combined and the combined solution was agitated for three hours at room temperature. The palladium ion was adjusted so that EO/Pd=16.36, 5.54, 3.27 based on the ethylene oxide (EO) constituting the block copolymer at this point.

Next a silicon substrate (Fuji Fine Technology Co., azimuth one hundred facets, thickness 525 µm±25 µm), the surface of which was made hydrophilic, was separately prepared by irradiating the substrate for ninety minutes at an irradiation distance of 2 mm using 172 nm vacuum ultraviolet light from a vacuum ultraviolet light irradiation device (Ushio Denki K.K., UEM20-172) under reduced pressure (170 Pa).

Figure 9:
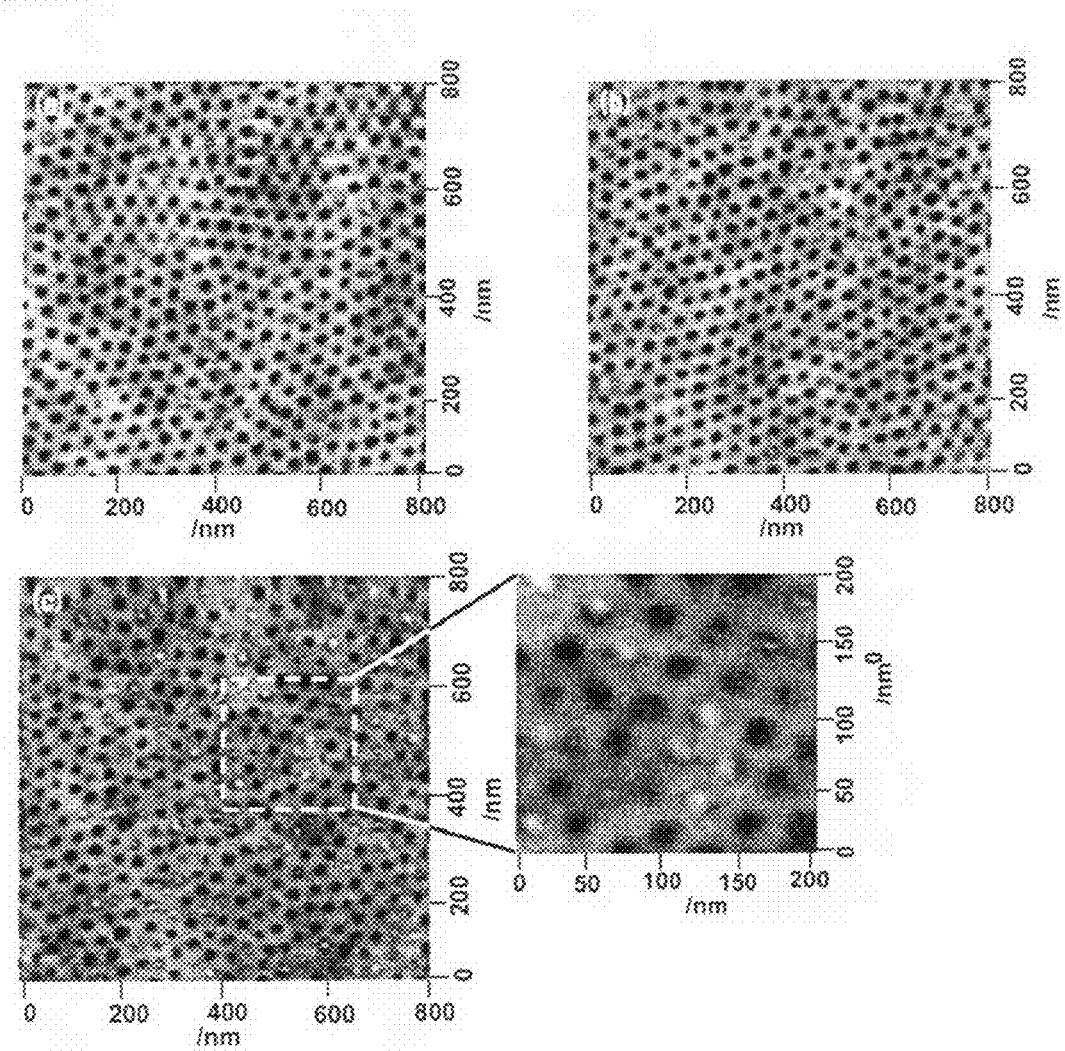
FIG. 9 shows the AFM height image of the nano phase separation membrane obtained by subjecting an amphiphilic block copolymer, PEO272-b-PMA(Az)74, to an interaction with palladium ion. (a) results from EO/Pd=16.36, (b) results from EO/Pd=5.54 and (c) results from EO/Pd=3.27.

The mixed solution prepared as described above was filtered using a syringe filter (Whatman Co., opening 0.45 µm), and 100 µl was subsequently added dropwise to a hydrophilic silicon substrate 1 cm×2 cm. A spin coater (Mikasa K.K., 1H-D7) was used at a rotary speed of 2,000 rpm for ten seconds to create a coating. The silicon substrate coated with the block copolymer was annealed for twelve hours at 140° C. under reduced pressure ($6.7 \times 10^{-2}$ Pa). The nano phase separation membrane obtained upon annealing was examined using an atomic force microscope (Seiko Instruments K.K., SPA400). The results are shown in FIG. 9. The data revealed that a nano phase separation structure was formed.

Figure 10:
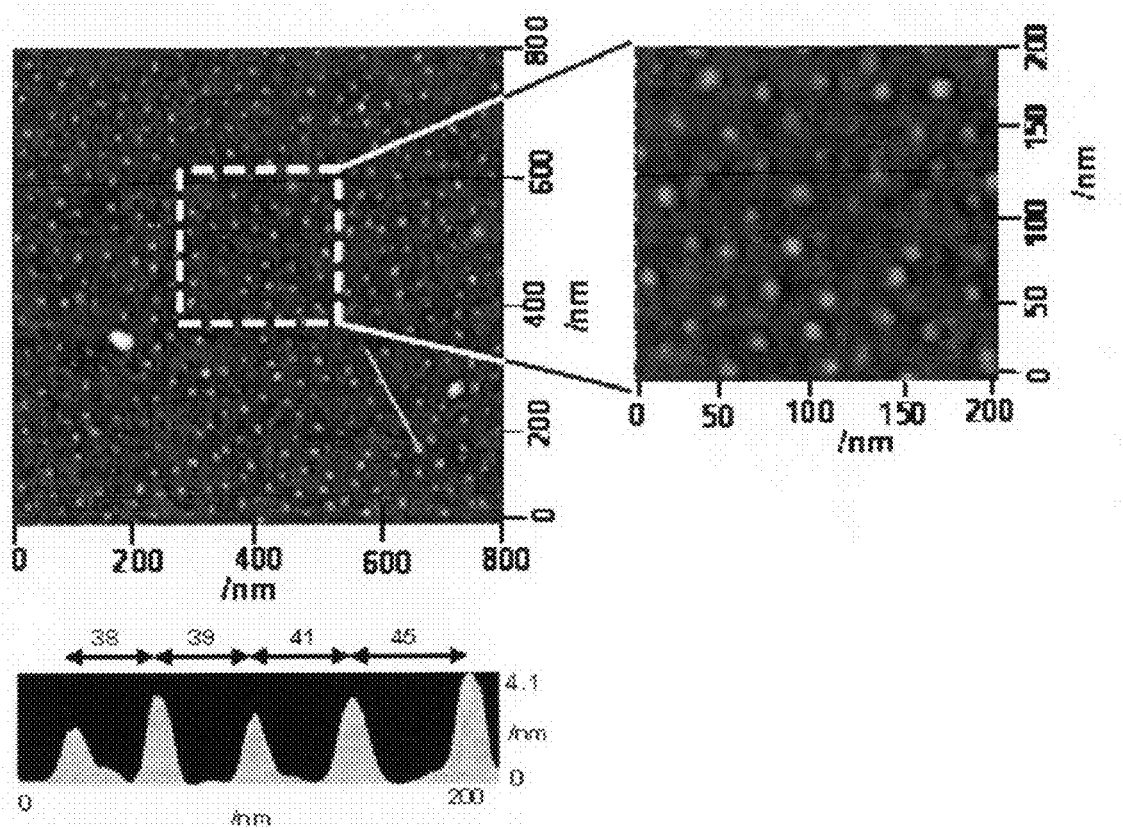
FIG. 10 shows an AFM height image of palladium nano dots formed on a silicon substrate.

The nano phase separation membrane obtained by the interaction with $Pd(acac)_2$ was irradiated for ninety minutes at an irradiation distance of 2 mm using a 172 nm vacuum ultraviolet light from a vacuum ultraviolet light irradiation device (Ushio Denki K.K., UEM20-172) under reduced pressure (170 Pa) at room temperature. After the membrane was decomposed and removed, the substrate was washed with methylene chloride (Wako Junyaku Kogyo) and subsequently with super pure water (18.2 MΩ·cm). The palladium dots formed on the substrate were examined using an atomic force microscope (Seiko Instruments K.K., SPA400). The results are shown in FIG. 10. Highly ordered Pd nano dots reflecting a PEO272-b-PMA(Az)74 structure with a cycle of about 40 nm, particle diameter of 17 nm and height of 3 nm were obtained. The distance between centers of the pillars (or dots) formed was 35 nm.

According to the X-ray photoelectron spectroscopic measurements of the substrate surface, a Pd4f electron peak was observed at 335 eV. The data obtained revealed that the organic materials on the substrate were decomposed and removed by the ozone generated with the vacuum ultraviolet light irradiation and the palladium ion was reduced to metallic palladium (zero valence).

EXAMPLE 5

A mixed solution was prepared by adding chloroauric acid ($HAuCl_4$) to a 3% by weight toluene solution of the amphiphilic block copolymer, PEO272-b-PMA(Az)102, obtained in Production Example 3 so that EO/Au=200. In addition, a silicon substrate (Fuji Fine Technology Co., azimuth one hundred facets, thickness 525 µm±25 µm) was separately prepared. The mixed solution prepared as described above was filtered using a syringe filter (Whatman Co., opening 0.45 µm), and 100 µl was subsequently added dropwise to a hydrophilic silicon substrate 1 cm×2 cm. A spin coater (Mikasa K.K., 1H-D7) was used at a rotary speed of 2,000 rpm for ten seconds to create a coating. The silicon substrate coated with the block copolymer was annealed for twenty-four hours at 140° C. to prepare a nano phase separation structure.

Next the nano phase separation membrane obtained by allowing the gold ion to interact was impregnated for several tens of seconds in an aqueous 0.1M sodium borohydrate solution ($NaBH_4$) to reduce the gold ion and the remove the membrane.

Figure 11:
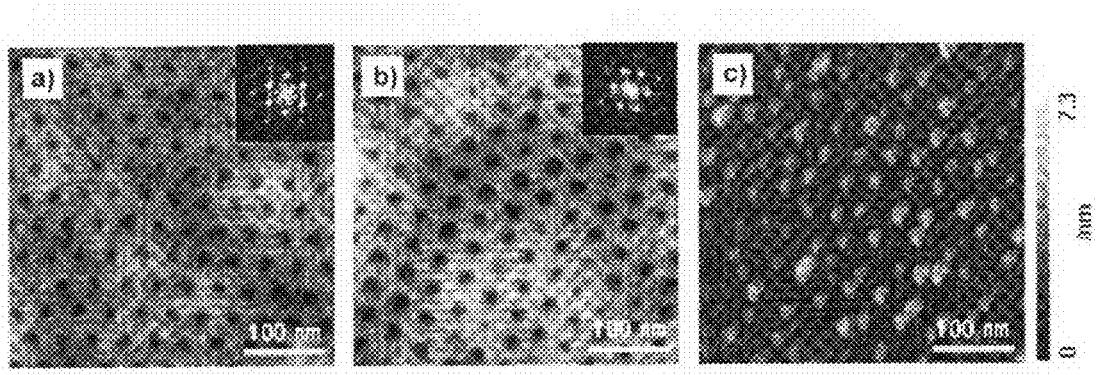
FIG. 11 shows an AFM shape image of the micro phase separation membrane prepared in Example 5.

The nano phase separation membrane obtained was examined using an atomic force microscope (Seiko Instruments K.K., SPA400). The results are shown in FIG. 11. (a) indicates the nano phase separation membrane doped with gold ion, and (b) indicates the membrane after a sixty second exposure to the aqueous sodium borohydrate solution.

Figure 12:
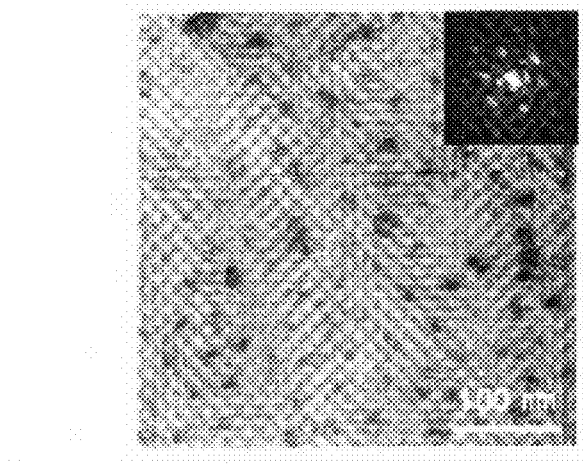
FIG. 12 shows a transmission electron microscope photograph of the micro phase separation membrane prepared in Example 5.

Furthermore, the results obtained upon exposing the membrane for sixty seconds to the aqueous sodium borohydrate solution and examining the product using a transmission electron microscope (Hitachi K.K., Hitachi H-800) are shown in FIG. 12. The metallic gold, which appears in black, spreads hexagonally, and the distance was in good agreement with the cylinder cycle $d_{PEO}$=38 nm of the nano phase separation membrane $PEO_{272}$-b-PMA(Az)$_{102}$ used as the template indicating that the gold ion incorporated into the PEO cylinder interior was reduced to metallic gold inside the cylinders.

In addition, the residual block copolymer was completely removed using an eximer VUV/O$_3$ washing device (Ushio Denki K.K., UEM20-172). The atomic force microscope image after the membrane was removed is shown in FIG. 11c. Highly ordered Au nano dots reflecting a PEO272-b-PMA(Az)102 structure of the amphiphilic block copolymer was obtained.

EXAMPLE 6

Figure 13:
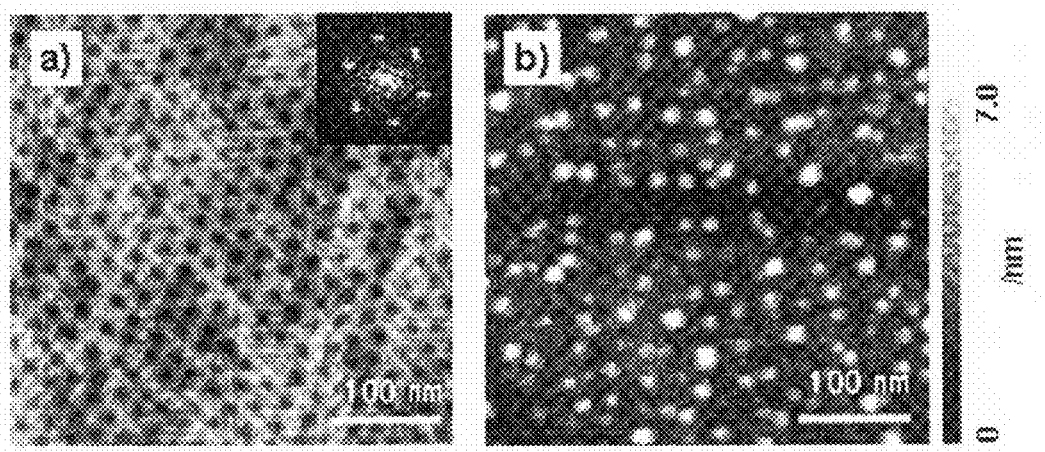
FIG. 13 shows an AFM shape image of the micro phase separation membrane prepared in Example 6.

A mixed solution was prepared by adding chloroauric acid (HAuCl$_4$) to a 2% by weight toluene solution of the amphiphilic block copolymer, $PEO_{114}$-b-PMA(Stb)$_{52}$, obtained in Production Example 3 so that EO/Au=200. The mixed solution prepared as described above was filtered using a syringe filter (Whatman Co., opening 0.45 μm), and 100 μl was subsequently added dropwise to a hydrophilic silicon substrate 1 cm×2 cm. A spin coater (Mikasa K.K., 1H-D7) was used at a rotary speed of 2,000 rpm for ten seconds to create a coating. The silicon substrate coated with the block copolymer was annealed for two hours at 190° C. under reduced pressure to prepare a nano phase separation structure. The nano phase separation membrane obtained after annealing was examined using an atomic force microscope (Seiko Instruments K.K., SPA400). The results are shown in FIG. 13a.

Figure 14:
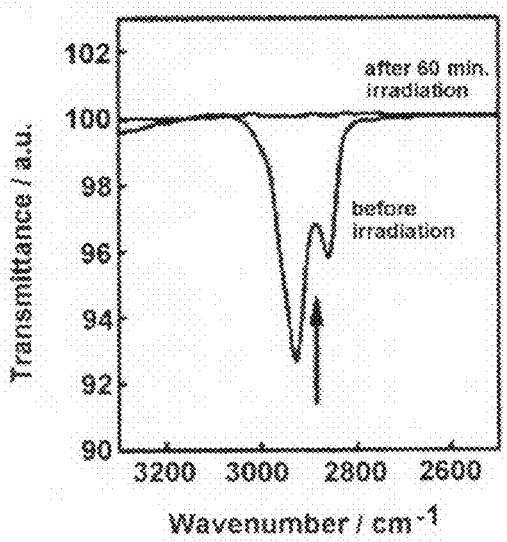
FIG. 14 shows the FT-IR spectrum of the nano phase separation membrane prepared in Example 6 and the change in the spectrum before and after vacuum ultraviolet light irradiation.
Figure 15:
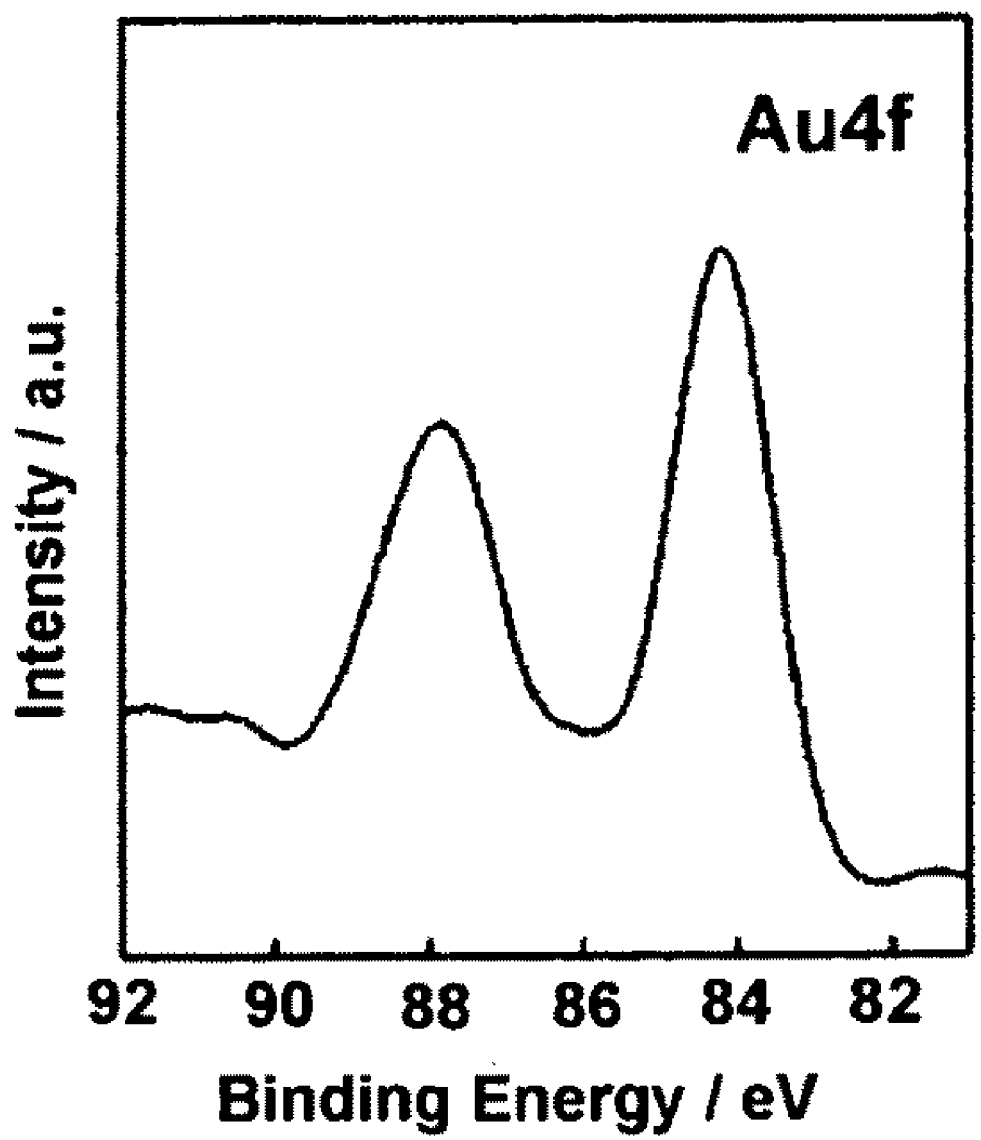
FIG. 15 is a spectrum of the gold nano dots in Example 6 obtained using X-ray electron spectroscopy.

Next the nano phase separation membrane that had been subjected to gold ion interaction was irradiated for sixty minutes at room temperature under reduced pressure (1.2×10$^3$ Pa) with 172 nm vacuum ultraviolet light from an irradiation distance of 20 mm using a vacuum ultraviolet light irradiation device (Ushio Denki Co., UEM20-172). The ozone generated during irradiation decomposed and removed the organic materials on the substrate, and the gold ion was also reduced to metallic gold. The IR spectra of the substrate before and after the vacuum ultraviolet light irradiation obtained using an FT-IR spectroscope (Nippon Bunko K.K., FT/IR-5300) were examined. The results are shown in FIG. 14. In addition, the results of X-ray photo electron spectroscopic measurements of the substrate surface are shown in FIG. 15. The Au4f electron peak was observed at 84 eV The data revealed that the organic materials on the substrate were decomposed and removed by the ozone generated, and the metal ion was reduced to metallic gold (zero valence).

After the membrane was decomposed and removed, the nano gold dots formed on the substrate were examined using an atomic force microscope (AFM) (Seiko Instruments K.K., SPA400). The results are shown in FIG. 13b. Highly orderly nano Au dots reflecting the $PEO_{114}$-b-PMA(Stb)$_{52}$ structures of the amphiphilic block copolymer were obtained.

What is claimed is:

1. A method for preparing a substrate with micrometallic masses aligned on its surface, wherein the substrate contains numerous zero valence fine metal masses aligned on the surface at intervals of 10 nm to 50 nm wherein the fine metal masses are pillar-shaped or dot-shaped or a combination thereof and have diameters of 3 nm to 15 nm wherein the pillar-shaped masses are oriented in a direction substantially perpendicular to the surface, wherein the method comprises the steps of (a) preparing a micro phase separation membrane of an amphiphilic block copolymer on a substrate, wherein the membrane has a thickness of about 50 nm to 1 μm, and then exposing the membrane to a solution containing metal ions, (b) drying the membrane to form a micro phase separation membrane with the metal ions localized in its hydrophilic segment, and (c) irradiating vacuum ultraviolet light on the micro phase separation membrane under vacuum to reduce the metal ions and, as a result of the irradiation, organic materials including those in the micro phase separation membrane are completely removed by the ozone generated with the vacuum ultraviolet light irradiation leaving the fine metal masses on the surface.

2. The method of claim 1 wherein the metal is a copper group metal or a platinum group transition metal.

3. The method of claim 1 or 2 wherein the amphiphilic block copolymer is represented by the general formula (1) below:

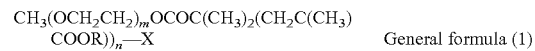
$CH_3(OCH_2CH_2)_m OCOC(CH_3)_2(CH_2C(CH_3)COOR))_n$—X    General formula (1)

wherein m and n, which may be identical or different from each other, are each independently an integer from 5 to 500, R is a substituent represented by the general formula (2) or (3) shown below, X represents a hydrogen atom or halogen atom;

—CH$_2$(CH$_2$)aCH$_2$O—B—N=N—B—R$^1$    General formula (2)

wherein a is an integer from 0 to 20, R$^1$ is a hydrogen atom or an alkyl group containing 1 to 22 carbon atoms and B represents a p-phenylene group;

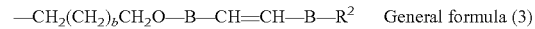
—CH$_2$(CH$_2$)$_b$CH$_2$O—B—CH=CH—B—R$^2$    General formula (3)

wherein b is an integer from 0 to 20, R$^2$ is a hydrogen atom or an alkyl group containing 1 to 22 carbon atoms and B represents a p-phenylene group.

* * * * *